United States Patent
Chang (10) Patent No.: US 7,806,344 B2
(45) Date of Patent: Oct. 5, 2010

(54) METHOD OF CLEANING DUST USING A COOLING FAN OF A COMPUTER AND RELATED DUST-CLEANING DEVICE

(75) Inventor: Shih-Chi Chang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 863 days.

(21) Appl. No.: 11/440,106

(22) Filed: May 25, 2006

(65) Prior Publication Data

US 2007/0095522 A1 May 3, 2007

(30) Foreign Application Priority Data

Nov. 3, 2005 (TW) .............................. 94138552 A (51) Int. Cl.
*F24F 7/00* (2006.01)
*H05K 7/20* (2006.01)
(52) U.S. Cl. ..................... 236/49.3; 361/695; 165/303
(58) Field of Classification Search ............... 236/49.3; 361/694, 695; 165/303
See application file for complete search history.

(56) References Cited

U.S. PATENT DOCUMENTS

| 4,337,497 | A | * | 6/1982 | Dalle Carbonare | 361/239 |
| 5,226,285 | A | * | 7/1993 | Dankowski | 62/184 |
| 5,361,188 | A | * | 11/1994 | Kondou et al. | 361/695 |
| 6,126,079 | A | * | 10/2000 | Shoemaker | 236/35 |
| 6,532,151 | B2 | * | 3/2003 | Osecky et al. | 361/679.48 |
| 2003/0093602 | A1 | * | 5/2003 | Chou et al. | 710/260 |
| 2006/0080982 | A1 | * | 4/2006 | Reichle | 62/181 |

FOREIGN PATENT DOCUMENTS

| CN | 2505755 Y | 8/2002 |
| TW | 578988 | 3/2004 |
| TW | 1220201 | 8/2004 |

* cited by examiner

*Primary Examiner*—Marc E Norman
(74) *Attorney, Agent, or Firm*—Bacon & Thomas, PLLC (57) ABSTRACT

A dust-cleaning device for a computer and a method using the same that utilizes a computer fan are disclosed. The computer is a laptop computer, a desktop computer, or a server. The method comprises: determining if a temperature of an electronic component is higher than a specific temperature; and if so, then reversing the computer fan for a specific amount of time as indicated by a timer.

21 Claims, 7 Drawing Sheets

METHOD OF CLEANING DUST USING A COOLING FAN OF A COMPUTER AND RELATED DUST-CLEANING DEVICE

BACKGROUND OF THE INVENTION

1. Field of the Invention

The present invention relates to an application of a cooling fan, and more particularly, to a method of cleaning dust using a cooling fan of a computer and a related dust-cleaning device.

2. Description of the Related Art

Today, most computers are thin, small and lightweight; they are high speed, highly efficient computing platforms. To increase the operating speeds of computers, electronic components in the computer need to operate at their maximum efficiencies. When the electronic components in the computer operate at their maximum efficiencies, the working frequencies of the electronic components are increased correspondingly. In order to avoid the high temperature damage that may result from high working frequencies, the manufacturer of the computer usually utilizes a cooling fan to reduce the temperature of the electronic components.

The cooling fan brings cooler air from outside the computer into the inside of the computer to reduce the temperature of the electronic components. However, the cooling fan also brings dust into the computer. Since the electronic components in the computer are compactly and tightly arranged for size reduction purposes, the air flow within the computer may be blocked, and the dust may collect on the cooling fan and/or the electronic components. Moreover, the dust is difficult to vent from the computer, since the air flow is obstructed.

When the cooling fan and/or the electronic components have collected a large amount of dust, the efficiency of the cooling fan is reduced (for example, the rotational speed of the cooling fan slows) because the cooler air flow brought by the cooling fan is reduced, which means the cooling efficiency is reduced as well. Consequently, it becomes more difficult to cool the electronic components, the efficiency of the computer is reduced and the electronic components may be damaged by the resultant high temperatures.

Therefore, it is desirable to provide a method of cleaning dust using a cooling fan of a computer and a related dust-cleaning device to mitigate and/or obviate the aforementioned problems.

SUMMARY OF THE INVENTION

A main objective of the present invention is to clean dust using a cooling fan of a computer apparatus by reversing rotation of the cooling fan for a predetermined time period.

Another objective of the present invention is to avoid low operating efficiencies or damage to the electronic components in a computer caused by dust by using a cooling fan of the computer to clean dust.

Another objective of the present invention is to ensure the working efficiency of a computer by utilizing a cooling fan of a computer apparatus to clean dust.

The present invention provides a method of cleaning dust using a cooling fan for a computer and a related dust-cleaning device. The computer may be a laptop computer, a desktop computer, or a server. The method comprises:

Step A: determining whether the temperature of an electronic component is higher than a predetermined temperature. In one embodiment, the electronic component may be a processor, a memory, a north bridge chip, a hard disk, or a VGA display card. Preferably, the predetermined temperature is substantially between 60° C. and 100° C.

Step B: if the temperature is higher than the predetermined temperature, reversing a cooling fan for a predetermined time as counted by a timer. In one embodiment, the predetermined time is shorter than 10 sec.

During the predetermined time period, if a sensor detects that the temperature of the electronic component falls below the predetermined temperature, indicating that dust has been cleaned, the cooling fan can be stopped early before the end of the predetermined time period. Therefore, in one embodiment, in step B, the method further comprises repeating step A; and if the temperature of the electronic component is lower than the predetermined temperature, the cooling fan stops.

Beyond monitoring the temperature to reverse the cooling fan, the present invention can also reverse the cooling fan for cleaning dust based on whether the rotational speed of the cooling fan is lower than a predetermined rotational speed. During the predetermined time period, if the sensor detects the rotational speed of the cooling fan is higher than the predetermined rotational speed, the cooling fan can be stopped early before the end of the predetermined time period. Therefore, in one embodiment, in step B, the method further comprises repeating the step of determining the rotational speed of the cooling fan; and if the rotational speed of the cooling fan is higher than the predetermined rotational speed, the cooling fan stops. Preferably, the predetermined rotational speed is substantially between 3,000 and 5,000 RPM.

The present invention can also work under a shutdown state. Therefore, in one embodiment, before determining whether the temperature of an electronic component is higher than a predetermined temperature, the present invention further comprises the steps of:

receiving a shutdown command issued from the OS; and calling an interrupt parameter, the interrupt parameter being defined in a computer BIOS for a shutdown procedure.

The present invention can also record the operating data so the technician may learn when the cooling fan begins to rotate in the reverse direction, the rotational speed of the fan, and how the temperature of the electronic components has lowered, so that the technician may adjust the predetermined temperature and/or the predetermined time. Therefore, in one embodiment, after the cooling fan has rotated in the reverse direction for the predetermined time period, the present invention further comprises:

obtaining operation data of the cooling fan; the operation data may include the rotational speed of the cooling fan, temperature data of the electronic components or time data for the timer; and writing the operation data of the cooling fan into a storage, the storage may be a CMOS, an EEPROM, a BIOS Flash ROM, or a TPM.

Alternatively, the method of the present invention may also perform the dust cleaning process while the electronic component is in an idle state. In one embodiment, before determining whether the temperature of an electronic component is higher than a predetermined temperature, the present invention further comprises the steps of:

determining whether the electronic component is in the idle state; for example, the C2 or C3 register of a south bridge chip may be checked to perform this determination; and if the electronic component is in the idle state, further determining whether the temperature of the electronic component is higher than the predetermined temperature.

The Step A, as above-mentioned, comprises determining whether the temperature of the electronic component is higher than the predetermined temperature. The determination according to another embodiment of the present invention is based on a rotational speed of a cooling fan. In this embodiment, it discloses a method of cleaning dust using a cooling fan, which comprises:

determining whether a rotational speed of the cooling fan is less than a predetermined rotational speed; in one embodiment, the predetermined rotational speed is substantially between 3,000 and 5,000 RPM; and if the rotational speed is less than the predetermined rotational speed, then reversing a cooling fan until a predetermined time expires as determined by a timer.

Similar to the aforementioned method, the step of reversing the cooling fan until the predetermined time expires as determined by the timer can be determined by a temperature of a component or can be determined by a rotational speed of a cooling fan as the condition to stop reversing the cooling fan. All the further steps are similar to the above description, and so require no further description.

Similarly, in this embodiment, the aforementioned step for cleaning dust can be operated when the computer is shutdown or in idle state. All the further steps are similar to the above description, and so require no further description.

In this preferred embodiment, it may store operation data of the cooling fan for technician's reference. For example, the operation data may include time, rotational speed, temperature, etc, The technician may learn when the cooling fan begins to rotate in the reverse direction, how fast is the rotational speed of the fan, and how the temperature of the electronic components has lowered. All the further steps are similar to the above description, and so require no further description.

Furthermore, the present invention also provides a dust-cleaning device for a computer, which utilizes the above-mentioned method. The computer may be a laptop computer, a desktop computer, or a server. The dust-cleaning device comprises: a cooling fan being able to rotate clockwise or counter-clockwise; a controller electrically connected to the cooling fan; a sensor electrically connected to the controller for detecting the temperature of an electronic component; a timer connected to the controller; and firmware stored in the controller. The dust-cleaning device according to this invention can perform the above-mentioned method by the firmware performing the steps of the method.

In one embodiment, the dust-cleaning device may therefore further comprise a computer BIOS and an operating system (OS). The BIOS may define an interrupt parameter. Therefore, the dust-cleaning device can perform dust clean according to the interrupt parameter when the shutdown command is executed.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
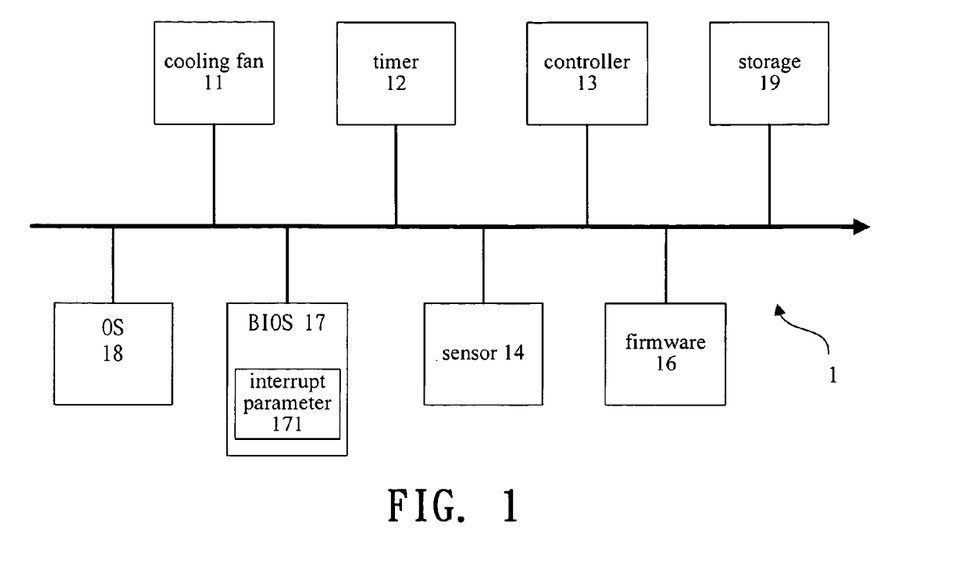
FIG. 1 is a functional block drawing of a dust-cleaning device according to the present invention.

Please refer to FIG. 1. The present invention provides a dust-cleaning device 1, which can be used in a computer (not shown). Since the visual appearance of the dust-cleaning device 1 or of the computer are not relevant characteristics of the present invention, no perspective drawings of the dust-cleaning device 1 or the computer are provided. The computer may be a laptop computer, a desktop computer, a server, or other equivalent device. The dust-cleaning device 1 comprises a cooling fan 11, a controller 13 and a sensor 14, and preferably further comprises a timer 12. In one embodiment, the dust-cleaning device 1 further comprises an operating system (OS) 18 and a computer BIOS 17.

Figure 2:
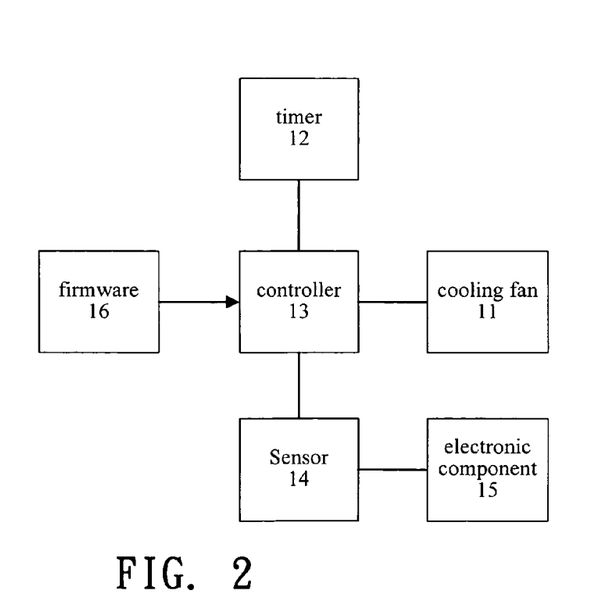
FIG. 2 is a schematic drawing of firmware for controlling a cooling fan via a controller according to the present invention.

Please refer to FIG. 1 and FIG. 2. The cooling fan 11 can rotate clockwise or counter-clockwise. When the cooling fan 11 rotates clockwise, cold air from outside of the computer is drawn into the computer to reduce the temperature of electronic components 15 in the computer. When the cooling fan 11 rotates counter-clockwise, dust in the computer can be vented. It should be understood that the cooling fan 11 rotate clockwise or counter-clockwise is only an example, which is not used to limit the present invention, which means the cooling fan 11 can rotate in opposite directions.

The controller 13 (such as a keyboard controller; KBC) is electrically connected to the cooling fan 11 and the sensor 14, and the sensor 14 is used for detecting the temperature of the electronic components 15 and/or detecting the rotational speed of the cooling fan 11. The electronic components 15 may be a processor (such as a CPU), memory, north bridge chipset, a hard disk, a VGA display card, or other equivalent elements.

The timer 12 is electrically connected to the controller 13. Firmware 16 is stored in the controller 13 for determining whether the temperature of the electronic components 15 exceed a predetermined temperature. When the temperature of the electronic components 15 exceeds the predetermined temperature, reversing the cooling fan 11 to rotate in an opposite direction until the timer 12 (such as a real time counter, oscillator or other equivalent element) counts down a predetermined time. Alternatively, in another embodiment, the firmware 16 stored in the controller 13 is used for determining whether the rotational speed of the cooling fan 11 is lower than a predetermined rotational speed; when the rotational speed of the cooling fan 11 falls below the predetermined rotational speed, reversing the cooling fan 11 to rotate in an opposite direction until the timer 12 counts down the predetermined time.

For different electronic components 15, different predetermined temperatures and different predetermined times may be designed into the firmware 16. The predetermined temperature is preferably set between 60° C. and 100° C., and the predetermined time is less than 10 sec. For example, the original design can be configured so that when the temperature of the electronic components 15 exceeds 60° C., the rotation of the cooling fan 11 will be reversed until the timer 12 counts up to 5 sec. Alternatively, when the rotational speed of the cooling fan 11 is less than 3,000 RPM, the cooling fan 11 can be designed to rotate in the reverse direction until the timer 12 counts up to 5 seconds.

In one embodiment of the present invention, the dust cleaning operation is performed when the computer is ready to shutdown. The dust-cleaning device 1 may therefore further comprise a computer BIOS 17 and an operating system (OS) 18. The BIOS 17 may define an interrupt parameter 171. When the user turns off the computer, the OS 18 issues a shutdown command for computer programs and calls the interrupt parameter 171 for shutdown procedures.

To assist a technician in the monitoring of the operations of the dust-cleaning device 1, the present invention may further comprise a storage 19 for storing operating data of the cooling fan 11. The operating data may include rotational speed data of the cooling fan 1, temperature data of the electronic components 15 or time data for the timer 12. The storage 19 may be a CMOS, an EEPROM, a BIOS Flash ROM, a TPM or other equivalent device. The technician may learn when the cooling fan 11 begins to rotate in the reverse direction, how fast is the rotational speed of the fan, and how the temperature of the electronic components 15 has lowered, so as to adjust the predetermined temperature and/or the predetermined time.

As a well-known technology, the cooling fan 11 of the dust-cleaning device 1 may be connected with a positive voltage or negative voltage to control whether the cooling fan 11 rotates clockwise or counter-clockwise, and the magnitude of the input voltage may control the rotational speed of the cooling fan 11. The technology related to controlling the rotational direction or the rotational speed of the cooling fan 11 requires no further description.

The present invention provides a method for cleaning dust with the cooling fan 11. Please refer to FIG. 3A and FIG. 3B. The method of the present invention utilizes the cooling fan of a laptop computer, the cooling fan of a desktop computer or the cooling fan of a server to remove dust.

Figure 3A:
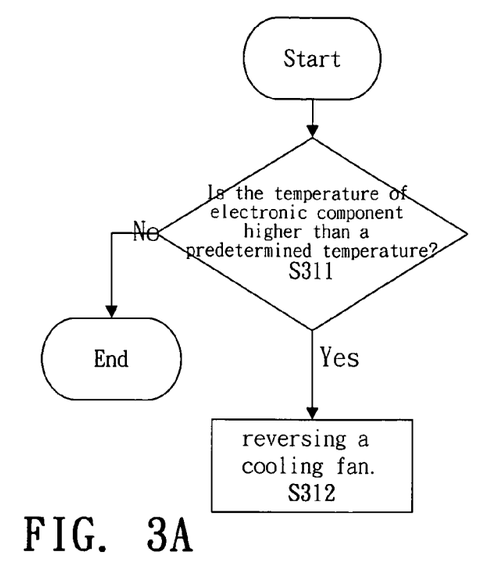
FIGS. 3A, 3B, 4A and 4B are different flowcharts of reversing the cooling fan according to the present invention.

After start, the process comes to Step S311: determining if the temperature of the electronic component 15 is higher than a predetermined temperature. The electronic component 15 may be a processor, a memory, a north bridge chip, a hard disk, or a VGA display card. As in the above description, the sensor 14 can be used for detecting the temperature of the electronic components 15. If the temperature exceeds the predetermined temperature, in step S312, the cooling fan 11 starts to rotate in the reverse direction. The predetermined temperature may be set between 60° C. and 100° C. If the temperature is not higher than the predetermined temperature, the process ends because it may indicate that the dust is not much enough to increase the temperature.

Figure 3B:
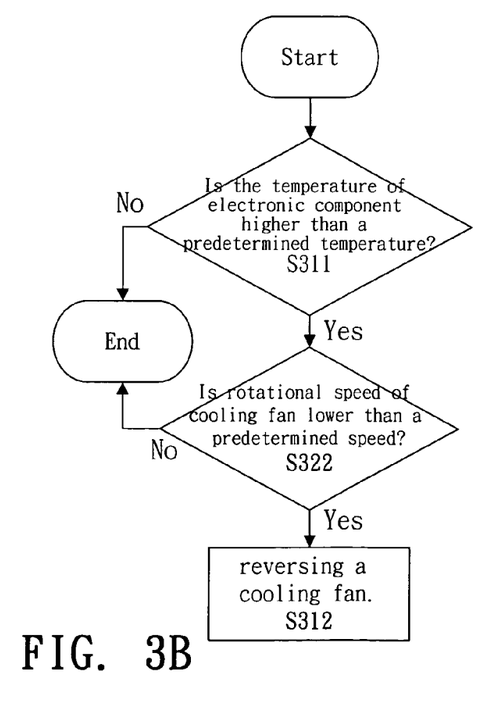

In one embodiment, to precisely detect whether the dust needs to be cleaned or removed, the method of the present invention has another step, as shown in FIG. 3B, after step S311, step S322: determining whether a rotational speed of the cooling fan 11 is less than a predetermined rotational speed. If the rotational speed is slower than the predetermined rotational speed, step S312 will be performed; otherwise, the process ends. The predetermined rotational speed may be set between 3,000 and 5,000 RPM.

Figure 4A:
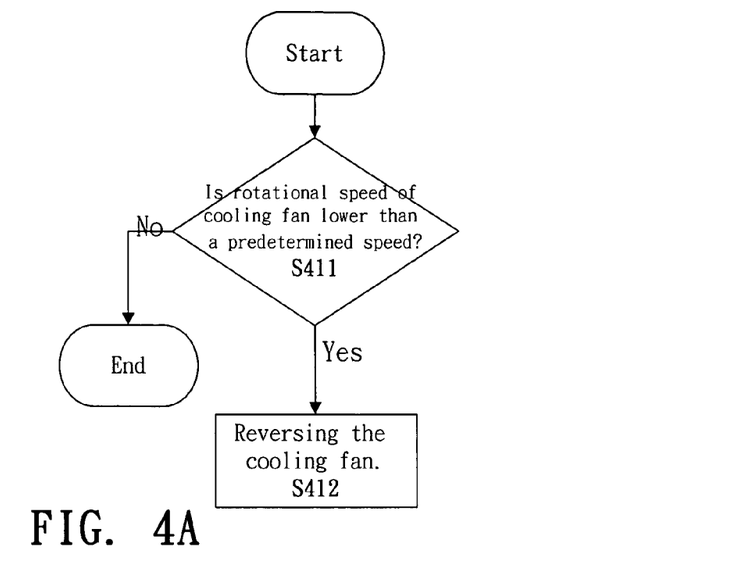
Figure 4B:
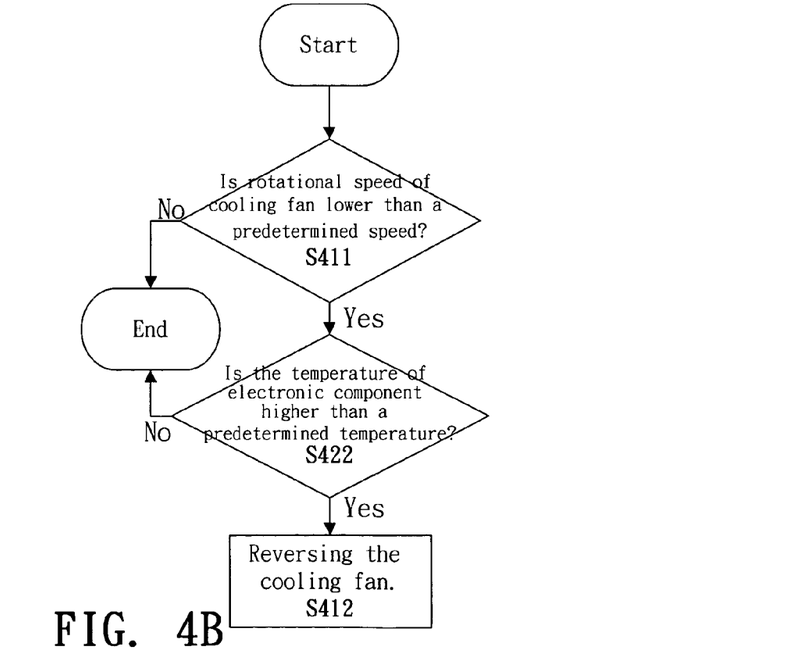

As shown in FIG. 4A and FIG. 4B, the method of the present invention can also detect whether a rotational speed of the cooling fan 11 is less than a predetermined rotational speed (step S411) first. If the rotational speed is less than the predetermined rotational speed, then step S412 is performed to reverse the rotation of the cooling fan 11. Alternatively, the method of the present invention performs step S411 first: if the rotational speed is slower than the predetermined rotational speed, then the temperature of the electronic component 15 may be checked to see if it is higher than the predetermined temperature (step S422). If the temperature of the component 15 is higher than the predetermined temperature, then the cooling fan 11 rotates in the reverse direction.

To avoid too frequent operations of the cooling fan 11 (including both clockwise and counter-clockwise rotation), the method of the present invention may be performed when the computer is ready to enter a shutdown state. Please refer to FIG. 5A. In the embodiment shown in FIG. 5A, the determination of the dust cleaning process is performed while the computer is in the shutdown state. When a user click a shutdown icon, the OS 18 issues a shutdown command, and computer programs receives the shutdown command and calls the interrupt parameter 171 of the BIOS 17 (step S51 and S52) for shutdown procedures.

Figure 5A:
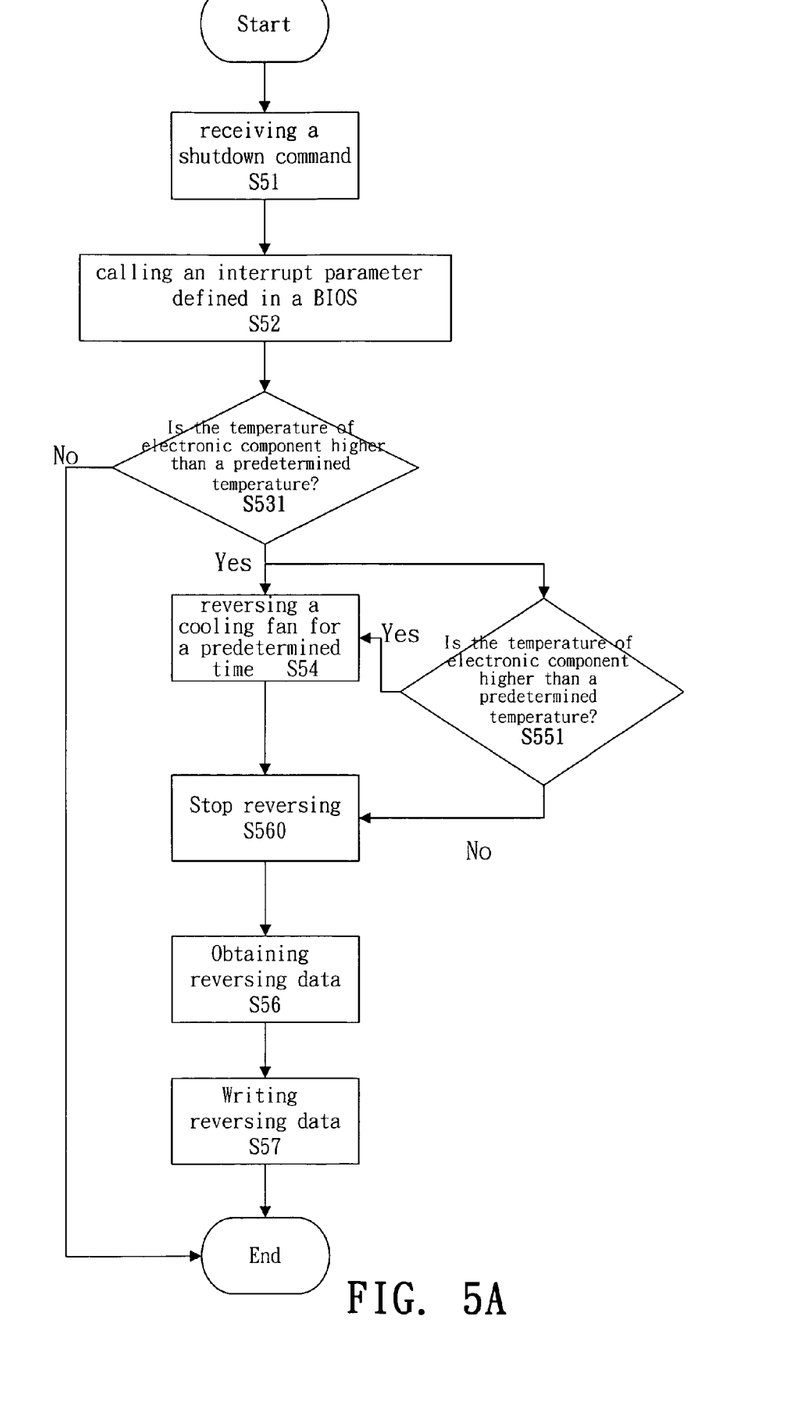
FIGS. 5A and 5B are flowcharts of an embodiment according to the present invention, which shows reversing a cooling fan of a computer when the computer is shutdown.

Step S531 and step S54 are similar to steps S311 and S312 in FIG. 3A, and so require no further description. Preferably, while step S54 is performed, the sensor 14 continuously detects the temperature of the electronic components 15, and the firmware 16 stored in the controller 13 further determines whether the temperature of the electronic components 15 exceeds the predetermined temperature (step S551); if the temperature is not higher than the predetermined temperature, then this indicates that the temperature of the electronic component 15 has lowered and the dust cleaning process can be stopped (step S560).

After the cooling fan 11 stops rotating in the reverse direction, preferably step S56 can be performed to obtain the operating data for the cooling fan 11 and step S57 can also be performed to write the operating data into the storage 19. The operating data may include the rotational speed data of the cooling fan 11, the temperature data of the electronic components 15 or time data for the timer 12, and so a technician may decide the appropriate settings for the predetermined temperature, the predetermined time and/or the predetermined rotational speed. After all steps have been performed, the process may end (for example, complete the shutdown procedures).

Figure 5B:
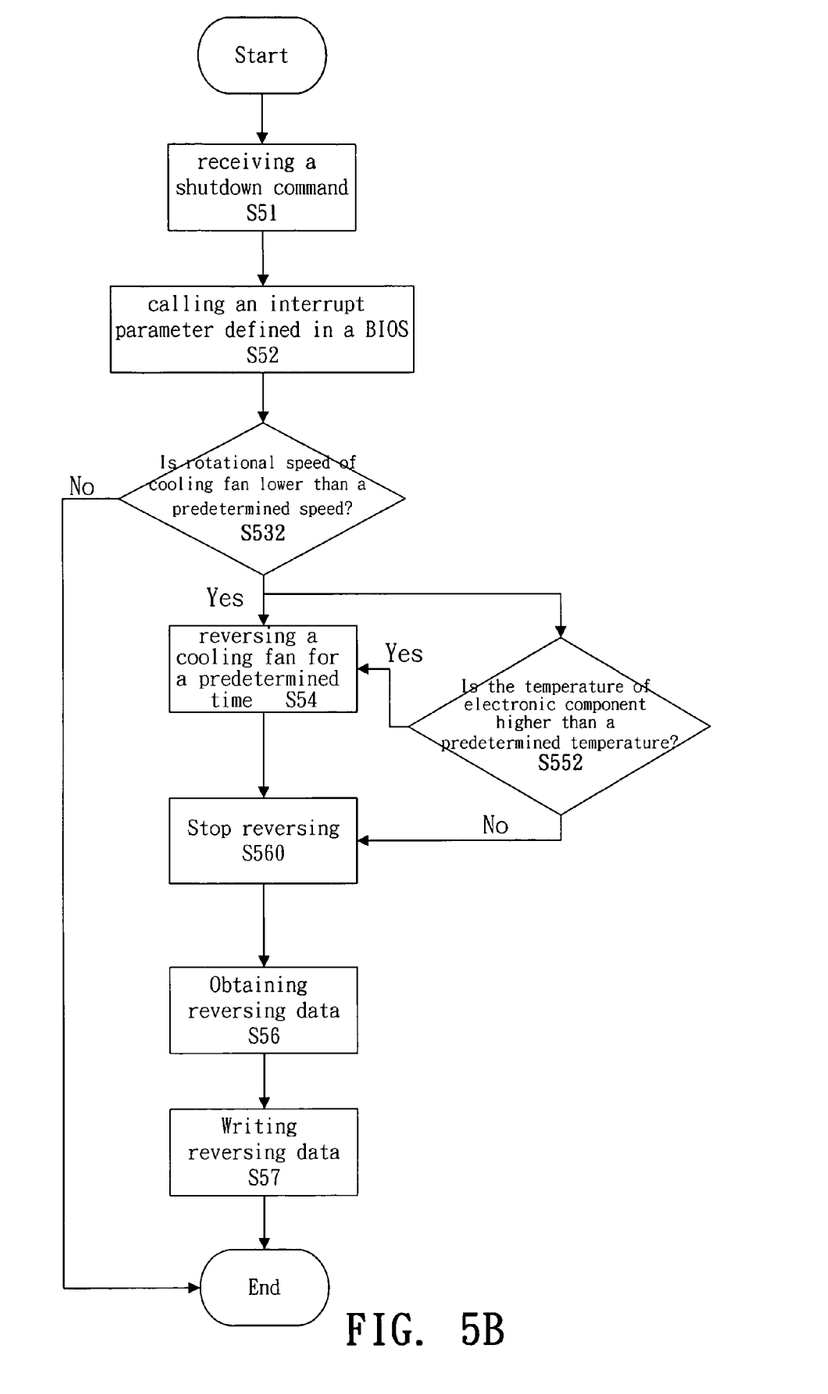

In the embodiment shown in FIG. 5A, the temperature of the electronic component 15 determines whether the cooling fan 11 should start to rotate in the reverse direction (step S531). Preferably, the temperature of the electronic components 15 (step S551) is repeatedly checked while the cooling fan 11 rotates in the reverse direction. Please refer to FIG. 5B. To reverse rotation of the cooling fan 11 can be determined according to the rotational speed of the cooling fan 11 (step S532). Preferably, when the cooling fan 11 rotates in the reverse direction, the sensor 14 continuously detects the temperature of the electronic components 15 (step S552). The determination, as shown in FIG. 5A and FIG. 5B, is determining when may stop the reverse rotation of the cooling fan 11. Alternatively, the step S551 in FIG. 5A can be changed into: determining the rotational speed of the cooling fan 11 (not shown), and/or the step S552 of FIG. 5B can also be changed into: determining the rotational speed of the cooling fan 11 (not shown).

The method of the present invention may also perform the dust cleaning process while the electronic component 15 is in an idle state. Please refer to FIG. 6A. In step S61, whether or not the electronic component 15 is in the idle state is determined; for example, the C2 or C3 register of a south bridge chip may be checked to determine whether the electronic component 15 is in the idle state. If the electronic component 15 is in the idle state, step S621 is performed; otherwise the process ends (for example, the computer is under a runtime state). Steps S621, S63, S641 and S65 shown in FIG. 6A are respectively similar to steps S531, S54, S551 and S560 shown in FIG. 5A, and so require no further description.

Figure 6A:
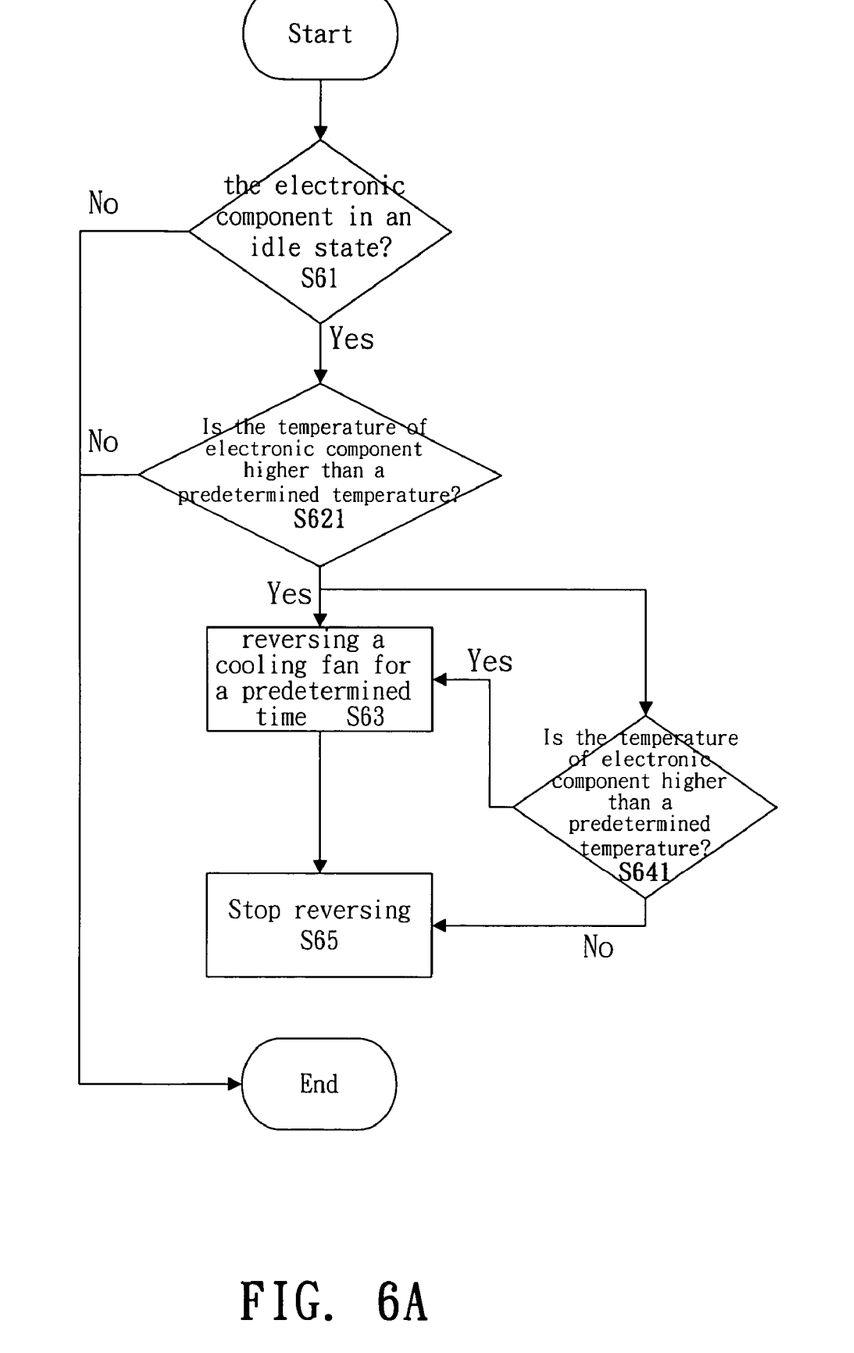
FIGS. 6A and 6B are flowcharts of another embodiment according to the present invention, which shows reversing a cooling fan of a computer when the computer is in an idle state.
Figure 6B:
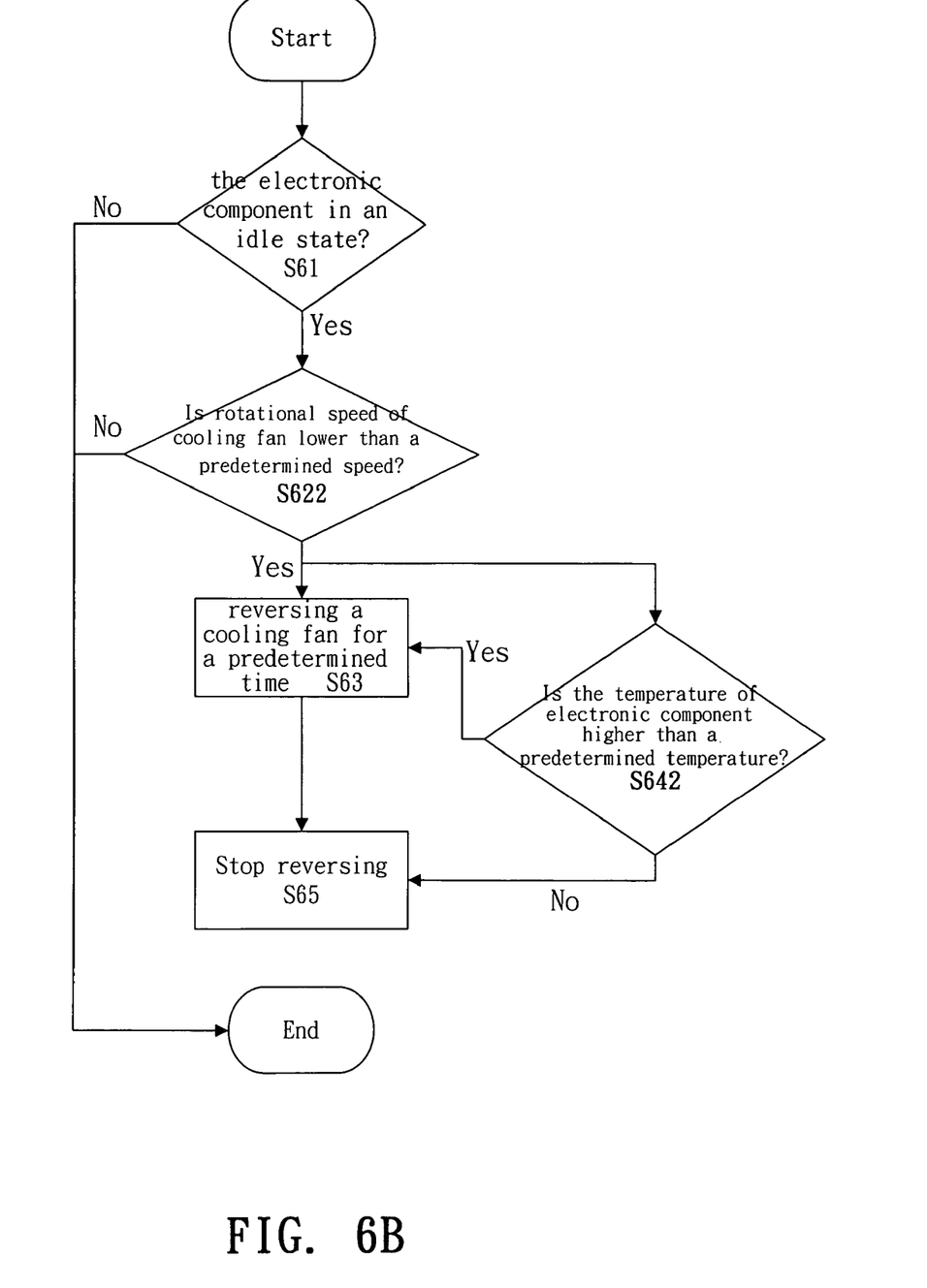

The main difference between FIG. 6B and FIG. 6A is that the reverse rotation of the cooling fan 11 is performed according to the rotational speed of the cooling fan 1 (step S622 shown in FIG. 6B) or according to the temperature of the component 15. Therefore, steps S622, S63, S642 and S65 shown in FIG. 6B are also respectively similar to steps S532, S54, S552 and S560 shown in FIG. 5B, and so require no further description.

According to the above description, a characteristic of the present invention is to determine when the dust is accumulated an amount, which maybe need to be cleaned; for example, too much dust may cause the electronic components 15 to increase higher temperatures (in other words, the cooling fan 11 may consequently have a poor cooling efficiency), or the cooling fan 11 may have a low rotational speed. Therefore, the temperature of the electronic components 15 and/or the rotational speed of the cooling fan 11 may be used for determining whether to begin reverse rotation of the cooling fan 11 to remove the dust. The predetermined temperature, the predetermined time (the time period for the reverse rotation of the cooling fan 11), and the predetermined rotational speed can be set and monitored by the technician. Moreover, the determination of the temperature of the electronic components 15 and/or the determination of the rotational speed of the cooling fan 11 can be performed in any order (as shown in FIG. 4B or FIG. 3B).

Although the present invention has been explained in relation to its preferred embodiment, it is to be understood that many other possible modifications and variations can be made without departing from the spirit and scope of the invention as hereinafter claimed.

What is claimed is:

1. A method of cleaning dust using a cooling fan comprising the steps of:
   receiving a shutdown command;
   calling an interrupt parameter, the interrupt parameter being defined in a BIOS of a computer;
   determining whether the temperature of an electronic component is higher than a predetermined temperature; and
   if the temperature is higher than the predetermined temperature, reversing the cooling fan for a predetermined time as counted by a timer to clean dust before the computer is totally shut down.

2. The method as claimed in claim 1, wherein the step of reversing the cooling fan further comprises: repeating the step of determining whether the temperature of the electronic component is higher than the predetermined temperature; and if the temperature is not higher than the predetermined temperature, then stopping the reversal of the cooling fan.

3. The method as claimed in claim 1, wherein the step of reversing the cooling fan for the predetermined time further comprises steps of: determining whether a rotational speed of the cooling fan is lower than a predetermined rotational speed; and if the rotational speed is not lower, stopping the reversal of the cooling fan.

4. The method as claimed in claim 3 further comprising the steps after the step of reversing the cooling fan for the predetermined time:
   obtaining operation data of the cooling fan for setting the predetermined temperature; and
   writing the operation data of the cooling fan into a storage.

5. The method as claimed in claim 3, wherein the predetermined rotational speed is substantially between 3,000 and 5,000 RPM (revolutions per minute).

6. The method as claimed in claim 1, wherein the predetermined temperature is substantially between 60° C. and 100° C.

7. The method as claimed in claim 1, wherein the predetermined time is less than 10 seconds.

8. The method as claimed in claim 1 wherein the predetermined temperature and the predetermined time differ depending on different electronic components and the temperature of the electronic components is repeatedly checked while the cooling fan rotates in the reverse direction.

9. A method of cleaning dust using a cooling fan comprising the steps of:
   receiving a shutdown command;
   calling an interrupt parameter, the interrupt parameter being defined in a BIOS of a computer;
   determining whether a rotational speed of the cooling fan is less than a predetermined rotational speed; and
   if the rotational speed is less than the predetermined rotational speed, then reversing the cooling fan for a predetermined time expires as determined by a timer to clean dust before the computer is totally shut down.

10. The method as claimed in claim, wherein the step of reversing the cooling fan for the predetermined time further comprises steps of:
    determining whether the temperature of an electronic component is higher than a predetermined temperature; and
    if the temperature of the electronic component is not higher than the predetermined temperature, stopping the reversing of the cooling fan.

11. The method as claimed in claim 10, further comprising the steps after the step of reversing the cooling fan for the predetermined time:
    obtaining operation data of the cooling fan for setting the predetermined rotational speed; and
    writing the operation data of the cooling fan into a storage.

12. The method as claimed in claim 10, wherein the predetermined temperature is substantially between 60° C. and 100° C.

13. The method as claimed in claim 9, wherein the step of reversing the cooling fan for the predetermined time further comprises the step of repeating the step of determining whether the rotational speed of the cooling fan is less than the predetermined rotational speed; if the rotational speed is not lower than the predetermined rotational speed, stopping reversal of the cooling fan.

14. The method as claimed in claim 9, wherein the predetermined time is less than 10 seconds.

15. The method as claimed in claim 9, wherein the predetermined rotational speed is substantially between 3,000 and 5,000 RPM.

16. A dust-cleaning device for a computer comprising:
    a cooling fan being able to rotate clockwise or counterclockwise;
    a controller electrically connected to the cooling fan;
    a sensor electrically connected to the controller for detecting the temperature of an electronic component; and
    firmware stored in the controller for performing the following steps of:
    receiving a shutdown command;
    calling an interrupt parameter, the interrupt parameter being defined in a BIOS of the computer;
    detecting if the temperature of the electronic component is higher than a predetermined temperature; and
    if the temperature is higher than the predetermined temperature, then reversing the cooling fan to clean dust before the computer is totally shut down.

17. The dust-cleaning device as claimed in claim 16 further comprising a timer electrically connected to the controller, and the cooling fan is reversed until a predetermined time expires as counted by the timer.

18. The dust-cleaning device as claimed in claim 17 further comprising a storage for storing operation data of the cooling fan, the firmware performing the following steps after the step of detecting if the temperature of the electronic component is higher than the predetermined temperature:
   obtaining the operation data of the cooling fan for setting the predetermined temperature; and
   writing the operation data of the cooling fan into the storage.

19. A dust-cleaning device for a computer comprising:
   a cooling fan being able to rotate clockwise or counter-clockwise;
   a controller electrically connected to the cooling fan;
   a sensor electrically connected to the controller for detecting the temperature of an electronic component; and
   firmware stored in the controller for performing the following steps:
      receiving a shutdown command;
      calling an interrupt parameter, the interrupt parameter being defined in a BIOS of the computer;
      determining whether a rotational speed of the cooling fan is lower than a predetermined rotational speed; and
      if the rotational speed is lower than the predetermined rotational speed, then reversing the cooling fan to clean dust before the computer is totally shut down.

20. The dust-cleaning device as claimed in claim 19 further comprising a timer electrically connected to the controller, and the cooling fan is reversed for a predetermined time expires as counted by the timer.

21. The dust-cleaning device as claimed in claim 20 further comprising a storage for storing operation data of the cooling fan, the firmware performing the following step after the cooling fan is reversed for the predetermined time expires as counted by the timer:
   obtaining operation data of the cooling fan for setting the predetermined rotational speed; and
   writing the operation data of the cooling fan into the storage.

* * * * *